(12) United States Patent
Merandat et al.

(10) Patent No.: US 7,788,550 B2
(45) Date of Patent: Aug. 31, 2010

(54) REDUNDANT BIT PATTERNS FOR COLUMN DEFECTS CODING

(75) Inventors: Marc Merandat, Bouc bel air (FR); Yves Fusella, Aubagne (FR)

(73) Assignee: Atmel Rousset S.A.S., Rousset, Cedex (FR)

( * ) Notice: Subject to any disclaimer, the term of this patent is extended or adjusted under 35 U.S.C. 154(b) by 302 days.

(21) Appl. No.: 11/958,200

(22) Filed: Dec. 17, 2007

(65) Prior Publication Data

US 2009/0158084 A1 Jun. 18, 2009

(51) Int. Cl.
G11C 29/00 (2006.01)
G06F 11/00 (2006.01)

(52) U.S. Cl. .............. 714/711; 714/718; 714/704; 365/200; 365/201

(58) Field of Classification Search ............... 714/718, 714/719, 721, 722, 23, 710, 711, 704, 706, 714/763, 799, 819, 823, 824; 365/200, 201
See application file for complete search history.

(56) References Cited

U.S. PATENT DOCUMENTS

| | | | |
|---|---|---|---|
| 5,233,610 A | 8/1993 | Nakayama et al. | |
| 5,361,227 A | 11/1994 | Tanaka et al. | |
| 5,933,377 A | 8/1999 | Hidaka | |
| 5,999,450 A | 12/1999 | Dallabora et al. | |
| 6,034,891 A | 3/2000 | Norman | |
| 6,081,911 A | 6/2000 | Pascucci | |
| 6,097,644 A * | 8/2000 | Shirley | 365/200 |
| 6,134,143 A | 10/2000 | Norman | |
| 6,158,016 A | 12/2000 | Pignon | |
| 6,388,929 B1 | 5/2002 | Shimano et al. | |
| 6,418,068 B1 | 7/2002 | Raynham | |
| 6,421,283 B1 | 7/2002 | Walley et al. | |
| 6,498,749 B1 | 12/2002 | Cuppens et al. | |
| 6,542,422 B1 * | 4/2003 | Furutani et al. | 365/200 |
| 6,574,156 B2 * | 6/2003 | Waller et al. | 365/200 |
| 6,643,195 B2 | 11/2003 | Eldredge et al. | |
| 6,788,575 B2 | 9/2004 | Kozakai et al. | |
| 6,992,937 B2 | 1/2006 | Tran et al. | |

OTHER PUBLICATIONS

ATMEL Corporation, International Search Report and the Written Opinion for PCT/US2008/086880 mailed Feb. 4, 2009, 12 pages.

* cited by examiner

*Primary Examiner*—Christine T Tu
(74) *Attorney, Agent, or Firm*—Fish & Richardson P.C.

(57) ABSTRACT

Techniques for coding and decoding redundant coding for column defects cartography. Defective cell groups identified in a memory array are redundantly encoded with a different bit pattern than the bit pattern used for functional cell groups. The identified defective cell groups are repaired using redundant cell groups in the memory array. The defective cell groups are later re-identified by checking the redundant bit pattern encoded in the cell groups. If new defective cell groups are identified, the memory array is identified as failing. If no new defective cell groups are identified, the memory array is identified as passing, and the identified defective cell groups are repaired.

15 Claims, 5 Drawing Sheets

FIG. 1

REDUNDANT BIT PATTERNS FOR COLUMN DEFECTS CODING

TECHNICAL FIELD

The subject matter of this patent application is generally related to electronic memory.

BACKGROUND

Non-volatile memory (NVM) is electronic memory that can retain stored information even when power is not being applied to the memory. Some types of NVM include Flash memory, electrically erasable programmable read-only memory (EEPROM), FeRAM (Ferro-electric memory), MRAM (Ferro-magnetic memory), and PCRAM (phase change memory). NVM is used in various applications where information may need to be retained without the use of power, such as cellular telephones, Universal Serial Bus (USB) flash drives, or digital cameras, etc.

SUMMARY

Techniques for coding and decoding redundant coding for column defects cartography are described. Defective cell groups identified in a memory array are redundantly encoded with a different bit pattern than a bit pattern used for functional cell groups. The identified defective cell groups are repaired using redundant cell groups in the memory array. The defective cell groups are later re-identified by checking the redundant bit pattern encoded in the cell groups. If new defective cell groups are identified, the memory array is identified as failing. If no new defective cell groups are identified, the memory array is identified as passing, and the identified defective cell groups are repaired.

Particular embodiments of the subject matter described in this specification can be implemented to realize one or more of the following advantages. Redundant coding for column defects cartography provides a way to safely store in a memory array the addresses of defective columns to be repaired in the memory array. This storage can also be done even on the defective columns themselves. The redundant coding is cost-effective, utilizing only a small fraction of the memory array for storing cartography data. The redundant decoding process is resistant to degradation due to data retention problems.

DESCRIPTION OF DRAWINGS

FIG. 1 shows an example memory array that includes redundant coding for column defects cartography.

DETAILED DESCRIPTION

Example Memory Array

Figure 1:
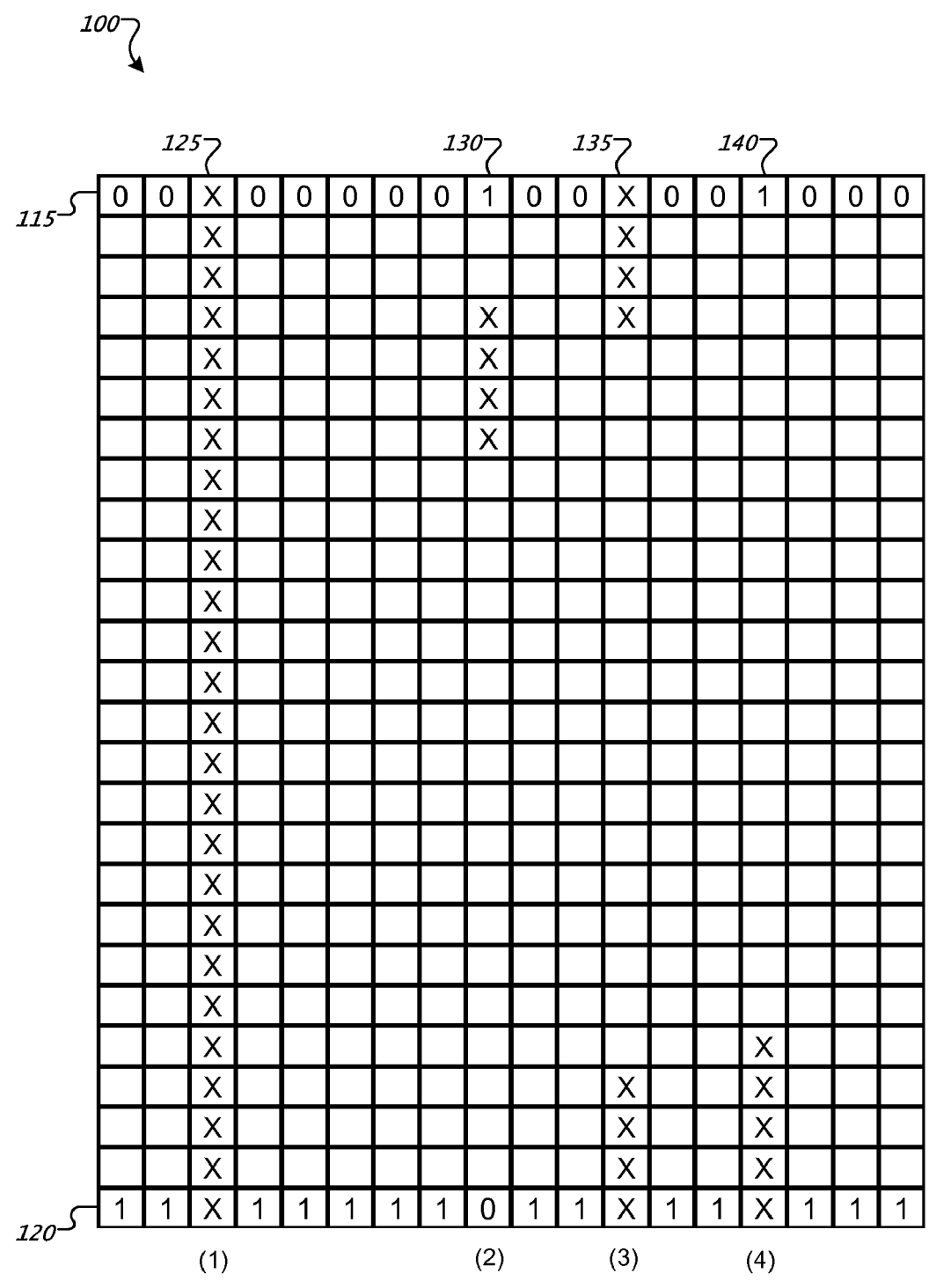
Figure 2:
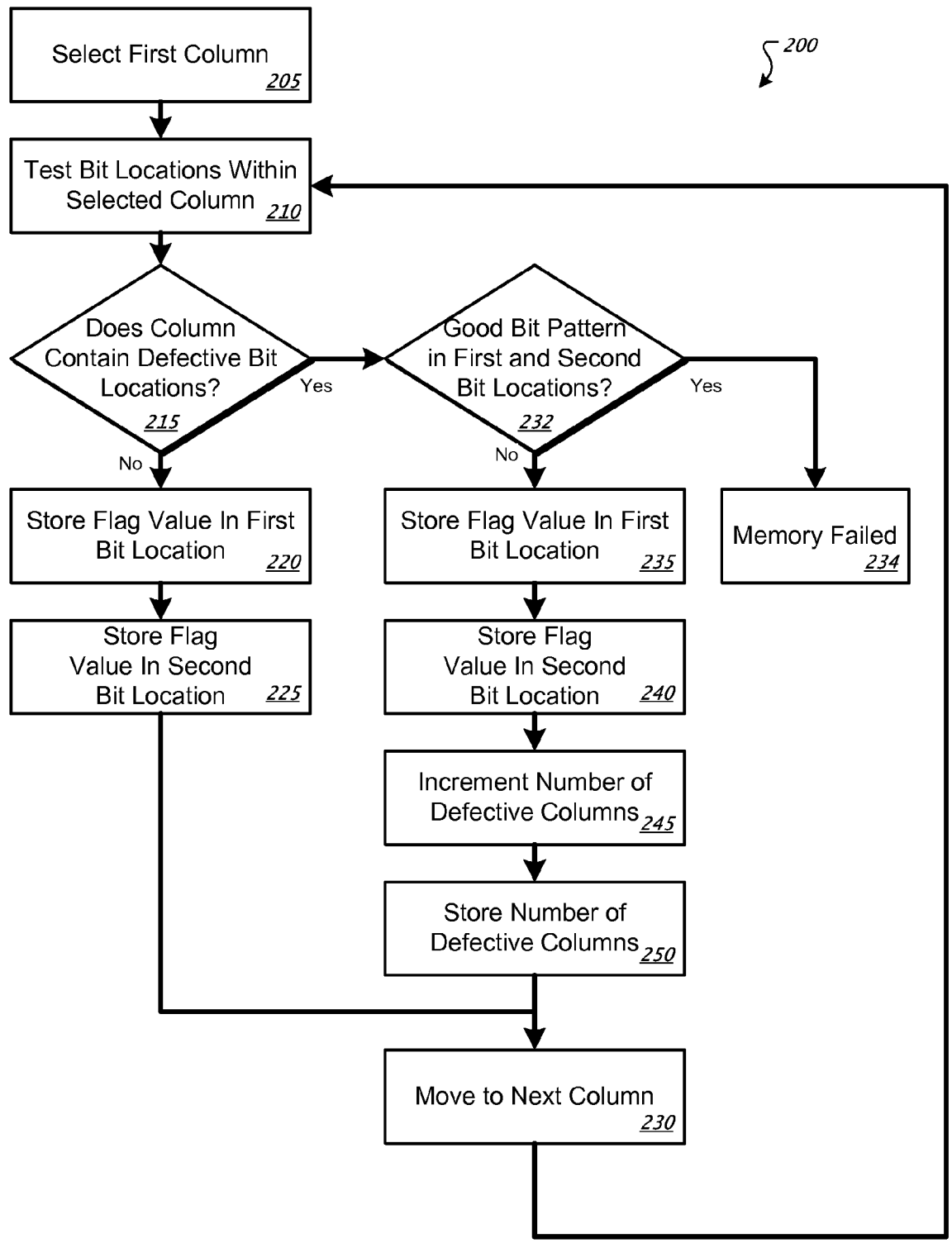
FIG. 2 shows an example process for redundant coding for column defects cartography.

FIG. 1 shows an example memory array 100 that includes redundant coding for column defects cartography. Generally, memory arrays such as the memory array 100 include a number of bit or cell locations organized as a collection of rows and columns formed on an integrated circuit (IC) or "chip". Each of the bit locations can store a "1" (e.g., "on") value or a "0" (e.g., "off") value. A row and a column value may be combined to form an address that a computing device can use to access the value stored by a particular bit location. Columns of bit locations can be used to form storage locations for blocks of values of various lengths, such as a byte that can be 8 bits or a word that can be 16 bits, 24 bits, 32 bits, 64 bits, or other bit lengths (e.g., depending on the device).

It is not uncommon, however, for some of the bit locations to be defective, for example, due to problems during IC manufacturing. One or more defective bit locations in a column can cause the entire column to be unusable. In some implementations, an IC with defective bit locations can be salvaged by testing the bit locations for defects, marking the defective bit locations by column, and then reassigning defective column addresses to other addresses of known functional columns in the memory array (e.g., reparation columns pre-allocated for memory repair).

In the example of FIG. 1, the memory array 100 includes a number of rows and columns, such as an upper bit row 115 (e.g., a first bit row), a lower bit row 120 (e.g., a last bit row), and columns 125, 130, 135, and 140. Each of the columns 125, 130, 135, and 140 includes an upper bit value in the upper bit row 115 and a lower bit value in the lower bit row 120.

During testing of the memory array 100, each of the bit locations is exercised (e.g., probed) to determine if the bit location is usable. In the illustration of the memory array 100, bit locations that are unusable are indicated with an "X." In columns where all the bit locations in the column are found to be usable, the column is marked as being usable by storing a value of "0" in the upper bit row 115 and by storing a value of "1" in the lower bit row 120.

Wherever a bad bit location is found, the entire column is considered defective or unusable as well. In some scenarios, unusable columns, such as the column 130, include usable bits in both the upper bit row 115 and the lower bit row 120. The column 130 includes defective bit locations and is marked as unusable by storing a value of "1" in the upper bit location (e.g., the upper bit row 115) and by storing a value of "0" in the lower bit location (e.g., the lower bit row 120).

Some columns can include bad bit locations in the upper bit row 115 or the lower bit row 120. For example, the column 140 includes a defective bit location in the lower bit row 120. During testing, a value of "1" is stored in the upper bit row 115. No value is written to the bit location in the lower bit row 120 since that bit location is defective.

Some columns may include bad bit locations in both the upper bit row 115 and the lower bit row 120. For example, the columns 125 and 135 both have bad bit locations in the upper bit row 115 and the lower bit row 120. In some implementations, no attempt is made to write to the bad upper and lower bit locations since the bit locations are unusable.

In some examples, a column may include a defective bit location in the upper bit row 115 that forces a value of "0" and a defective bit location in the lower bit row 120 that forces a value of "1." When this scenario is detected, the memory array 100 is considered unusable.

Once all the columns in the memory array 100 have been marked, the number of unusable columns (e.g., those not marked with a "0" in the upper bit row 115 and a "1" in the lower bit row 120) is determined. In some implementations, a value that represents the number of unusable columns is incremented (e.g., in a counter) after each unusable column is identified. When the number of unusable columns is greater than a number of available redundant columns (e.g., reparation columns), the memory array 100 is considered unusable and may be flagged as failing. The total number of unusable columns is stored in a location in the memory array 100 for later use, which will be described in reference to FIG. 2. The unusable columns are repaired, which will be described in reference to FIG. 3. In some implementations, the unusable columns are repaired before the total number of unusable columns is stored.

Column Defect Cartography Coding Process

FIG. 2 shows an example process 200 for redundant coding for column defects cartography. The process 200 includes marking columns of a memory array, such as the memory array 100. The process 200 begins by selecting a first column of bit locations (e.g., memory cells) (step 205). All the bit locations within the column are tested (e.g., probed) to detect defective memory bit locations (step 210).

When all the bit locations within the column are tested and all the bit locations are found to be usable, the column is determined to be good ("No" branch of decision 215). The column is marked as good by storing a flag value in a first bit location (step 220) and by storing a flag value in a second bit location (step 225). The flag values for the two bit locations can differ. For example, in some implementations, a column can be marked as "good" by storing a value of "0" in the upper bit location in the column and by storing a value of "1" in the lower bit location of the column. The process moves to the next column (step 230) and continues by testing the next column for unusable bit locations (step 210).

When one or more bit locations within the column are tested and found to be unusable, the column is determined to be bad ("Yes" branch of decision 215). The first bit location and the second bit location are checked to determine whether the bit locations match a "good" bit pattern (decision 232). The "good" bit pattern is the bit pattern stored in a column determined to be good. That is, if a column is marked as "good" by storing "0" and "1" in the upper bit location and the lower bit location, respectively, then the "good" bit pattern is "0" in the upper bit location and "1" in the lower bit location, respectively. When the "good" bit pattern is determined to be in the first and second bit locations in the column ("Yes" branch of decision 232), the memory array is considered unusable and fails (step 234). An indication of memory array failure can be given.

When the "good" bit pattern is determined not to be in the first and second bit locations in the column ("No" branch of decision 232), the column is marked as bad by storing a flag value in the first bit location (step 235) and by storing a flag value in the second bit location (step 240). For example, in some implementations, a column can be marked as "bad" by storing a value of "1" in the upper bit location in the column and by storing a value of "0" in the lower bit location of the column.

A value that represents the number of defective columns is incremented (e.g., in a counter) (step 245) and stored (e.g., in a register file) (step 250). In some implementations, when the number of defective columns exceeds a threshold (e.g., a number of available reparation columns) the entire memory array can be declared to be unusable. The process moves to the next column (step 230) and continues by testing the next column (step 210). In some implementations, once the entire memory array is determined to be unusable, the process 200 terminates and an indication of memory array failure is given.

Column Defect Cartography Decoding Process

Figure 3:
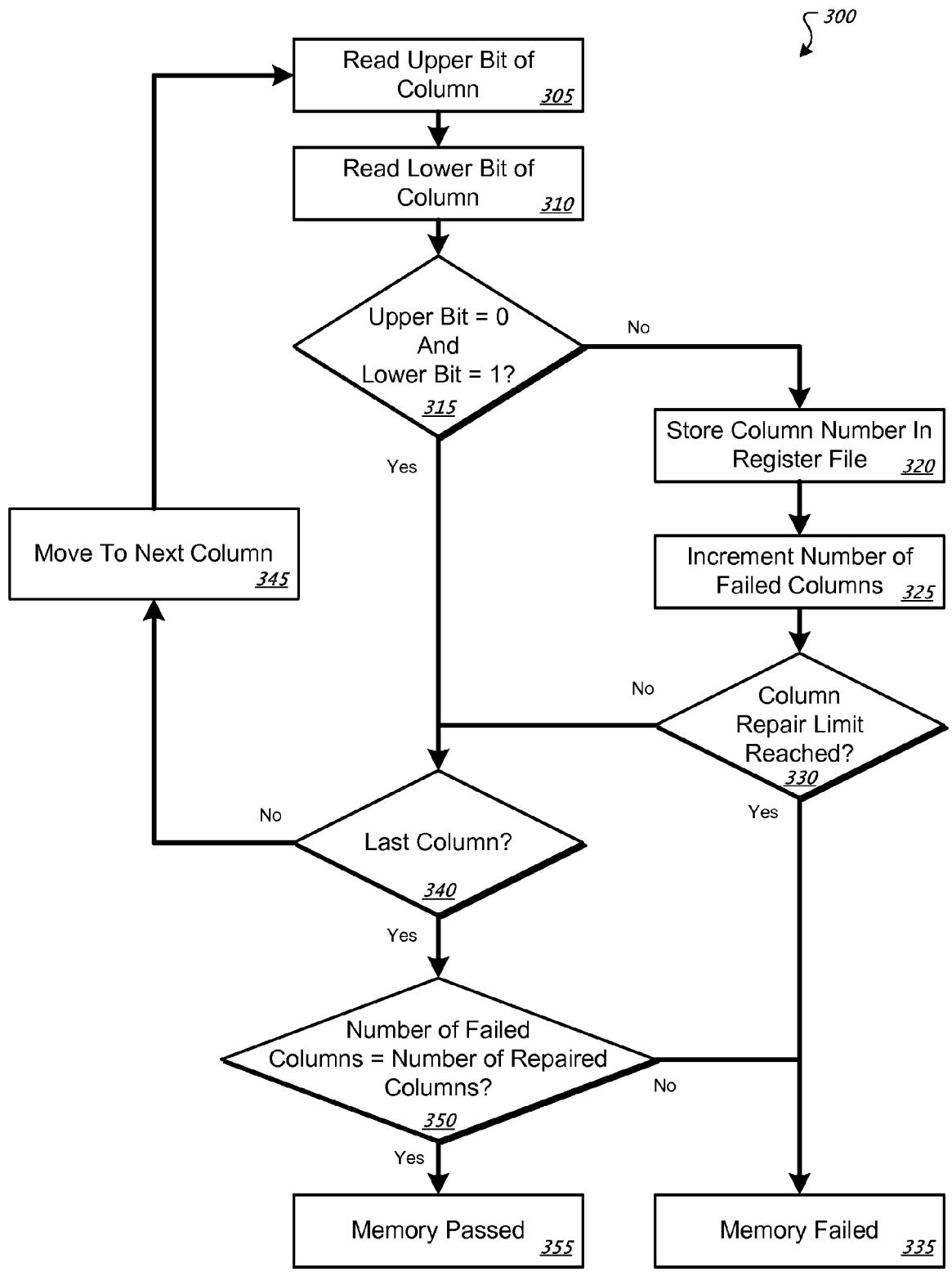
FIG. 3 shows an example process for decoding redundant coding for column defects cartography.

FIG. 3 shows an example process 300 for decoding redundant coding for column defects cartography. In general, the process 300 is executed at the start-up of a memory array such as the memory array 100. For example, the process 300 can be performed each time power is applied to the IC that includes the memory array. The process 300 locates and records the quantity and locations of defective columns. In some implementations, the process can be executed by a processing device that is included on the same IC as the memory array. In other implementations, the process can be executed by a processing device that is not included on the same IC as the memory array.

The process 300 begins by reading the upper bit of a column (step 305). The process continues by reading the lower bit of the column (step 310). In some implementations, the column read during the process 300 may be the first column in the memory array. When the upper bit has a value of "0" and the lower bit has a value of "1," the column is determined to be good ("Yes" branch of decision 315).

When the upper bit does not have a value of "0" or the lower bit does not have a value of "1," the column is determined to be bad ("No" branch of decision 315), the column number (e.g., an identifier or an index) is stored in a register file (step 320), and a value that represents the number of failed columns is incremented (e.g., in a counter) (step 325). In some implementations, the value that represents the number of failed columns and/or the register file is stored in the memory array. In some implementations, the value that represents the number of failed columns and/or the register file is stored in a location that is separate from the memory array (e.g., RAM, magnetic storage, processor registers).

When the value that represents the number of failed columns is determined to have reached a column repair limit ("Yes" branch of decision 330), the memory has failed (step 335). In some implementations the column repair limit is equal to a number of redundant columns (e.g., reparation columns) in the memory array. When the value that represents the number of failed columns is determined not to have reached the column repair limit ("No" branch of decision 330), the column is evaluated to determine if the column is the last column of the memory array (decision 340). When the column is determined not to be the last column ("No" branch of decision 340), the process moves to the next column (step 345). Similarly, when the column is determined to be good ("Yes" branch of decision 315) and is determined not to be the last column ("No" branch of decision 340), the process moves to the next column (step 345).

When the column is determined to be the last column ("Yes" branch of decision 340), the value that represents the number of failed columns is compared to a number of repaired columns (decision 350). In some implementations, the number of repaired columns is a value that was previously stored in the memory array, such as during the testing of the memory array 100 that was previously described with respect to FIG. 1. When the number of failed columns is determined to be equal to the number of repaired columns ("Yes" branch of decision 350), the memory array has passed (step 355). In some implementations, when the memory array passes (step 355), the failed columns are repaired with redundant columns (e.g., reparation columns) in the memory array. When the number of failed columns is determined not to be equal to the number of repaired columns ("No" branch of decision 350), the memory array has failed (step 335). When the number of failed columns differs from the number of repaired columns, one or more columns may have become defective since the time the memory array was originally tested. New column failures may be due to a data retention problem.

In some implementations, an indication of whether the memory array passes (step 355) or fails (step 335) is given. In some implementations, when it is determined that the memory array has failed (step 335), one or more actions can be taken, where at least one of the one or more actions depends on a security level of data stored in the memory array. For example, if the data stored in the memory array is sensitive data (e.g., personal information or security information), an indication of a failed memory array may trigger the sensitive data stored in the memory array to be erased.

Defective Column Relocation Process

Figure 4:
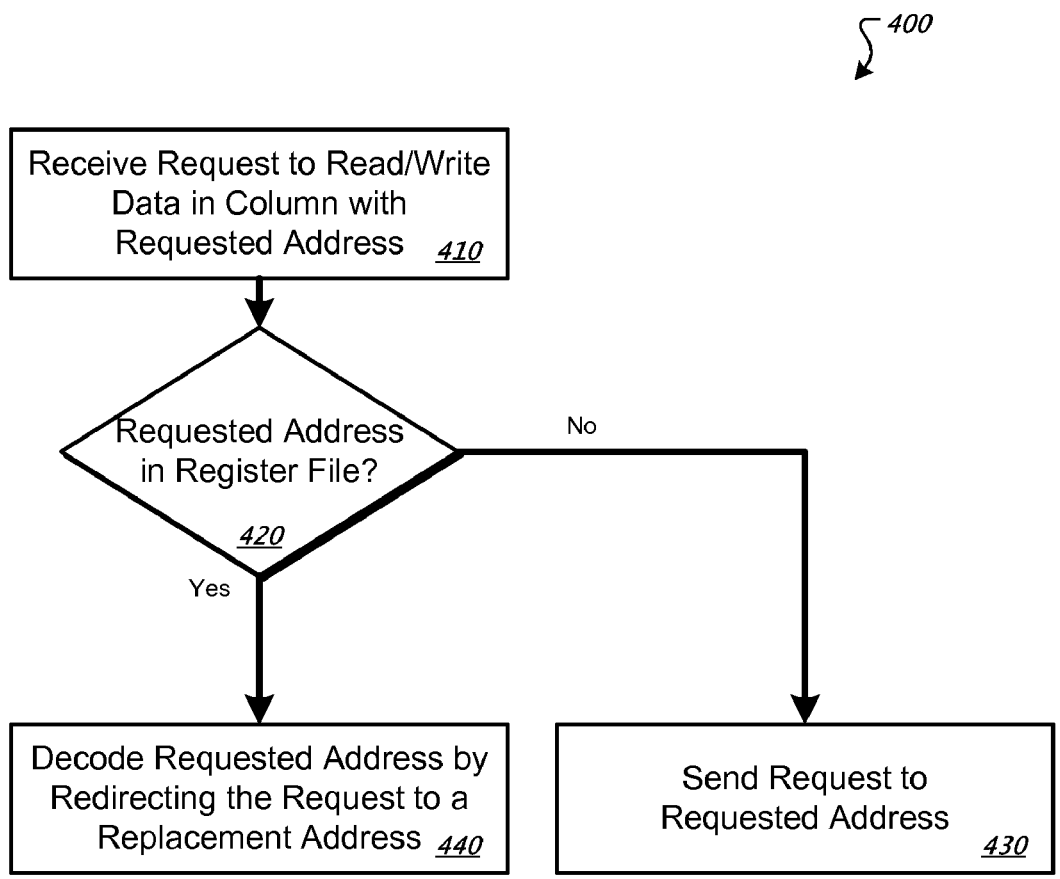
FIG. 4 shows an example process for defective column relocation using column defects cartography.

FIG. 4 shows an example process 400 for defective column relocation using column defects cartography. In general, requests for data from data columns in a non-volatile memory (NVM) may be decoded using the process 400 to intercept requests to store and/or read data to/from defective bit columns and reroute the requests to usable replacement addresses in the NVM. In some implementations, the NVM is the memory array 100.

Requests to read and/or write data to and/or from a column in the NVM are received by the process 400 (step 410), where the request includes a requested address for the requested column. A register file is checked to determine if the requested address is stored in the register file (decision 420). A register file includes a collection of addresses of known defective columns in the NVM. In some implementations, the register file may include addresses that are stored by the process 300 (step 320) of FIG. 3. In some implementations, the register file has a number of entry locations equal to the number of redundant columns (e.g., the column repair limit) in the memory array. If it is determined that the requested address is not included in the register file ("No" branch of decision 420), the request is sent to the requested address without decoding the requested address (step 430). The non-decoded requested address is used to access a location in the NVM.

If it is determined that the requested address is included in the register file as a defective column address ("Yes" branch of decision 420), the requested address is decoded by an address replacement process (step 440), which includes redirecting the request from the requested, but faulty, address to a known, good replacement address in the NVM. For example, if a requested address is found as the second entry in the register file, this information (e.g., the index of the register file where the requested address is stored) may be used to redirect the request to a second replacement address in the NVM. Similarly, determining that a request to read or write data includes a requested address stored as the seventh entry in the collection of addresses of defective columns will cause the address replacement process to redirect the request to a seventh known, good replacement address.

Various implementations and processes described in this document refer to data being stored and processed as columns and rows. The implementations and processes described herein are not limited to the orientations described, but may be practiced in any orientation. For example, the memory array 100 may store byte, word, or other length values as rows, and the flag bits stored in the upper bit row 115 and the lower bit row 120 may be stored in a left bit column and a right bit column, respectively. A group of cell (e.g., bit) locations can be arranged as a row of cells or a column of cells. Other arrangements for cell groups are possible.

The bits that have been described as the "upper bit" and/or "lower bit" do not necessarily have to be located at the first and last bits in a column or row of bit locations. The "upper" and "lower" bits may be located anywhere within the column or row, or elsewhere in the memory array 100. Although the bit pattern for indicating a functional column is described as being a "0" in an upper bit location and a "1" in a lower bit location, other bit patterns are possible (e.g., "1" in the upper bit location and "0" in the lower bit location). The bit pattern for a defective column is the bit pattern with bit values which are opposite of the respective bit values of the bit pattern for a functional column. For example, if both bits are set to "0" for a functional column, both bits should be set to "1" for a defective column.

The implementations and processes described herein use two bits to identify defective columns, rows, or cell groups, but are not limited to the use of two bits. Defective columns may be identified by collections of two, three, four, or more bits that may be configured to indicate whether the row, column, or cell group is usable for data storage and/or retrieval.

All of the functional operations described in this specification can be implemented in digital electronic circuitry, or in computer hardware, firmware, software, or in combinations of them. Apparatus of the subject matter described in this specification can be implemented in a computer program product tangibly embodied in a machine-readable storage device for execution by a programmable processor; and method steps of the subject matter described in this specification can be performed by a programmable processor executing a program of instructions to perform functions by operating on input data and generating output.

The subject matter described in this specification can be implemented advantageously in one or more computer programs that are executable on a programmable system including at least one programmable processor coupled to receive data and instructions from, and to transmit data and instructions to, a data storage system, at least one input device, and at least one output device. Each computer program can be implemented in a high-level procedural or object-oriented programming language, or in assembly or machine language if desired; and in any case, the language can be a compiled or interpreted language.

Suitable processors include, by way of example, both general and special purpose microprocessors. Generally, a processor will receive instructions and data from a read-only memory and/or a random access memory. Generally, a computer will include one or more mass storage devices for storing data files; such devices include magnetic disks, such as internal hard disks and removable disks; a magneto-optical disks; and optical disks. Storage devices suitable for tangibly embodying computer program instructions and data include all forms of non-volatile memory, including by way of example, semiconductor memory devices, such as EPROM, EEPROM, and flash memory devices; magnetic disks such as internal hard disks and removable disks; magneto-optical disks; and CD-ROM disks. Any of the foregoing can be supplemented by, or incorporated in, ASICs (application-specific integrated circuits).

To provide for interaction with a user, the subject matter described in this specification can be implemented on a computer system having a display device such as a monitor or LCD screen for displaying information to the user and a keyboard and a pointing device such as a mouse or a trackball by which the user can provide input to the computer system.

The computer system can be programmed to provide a graphical user interface through which computer programs interact with users.

Example Computer System

Figure 5:
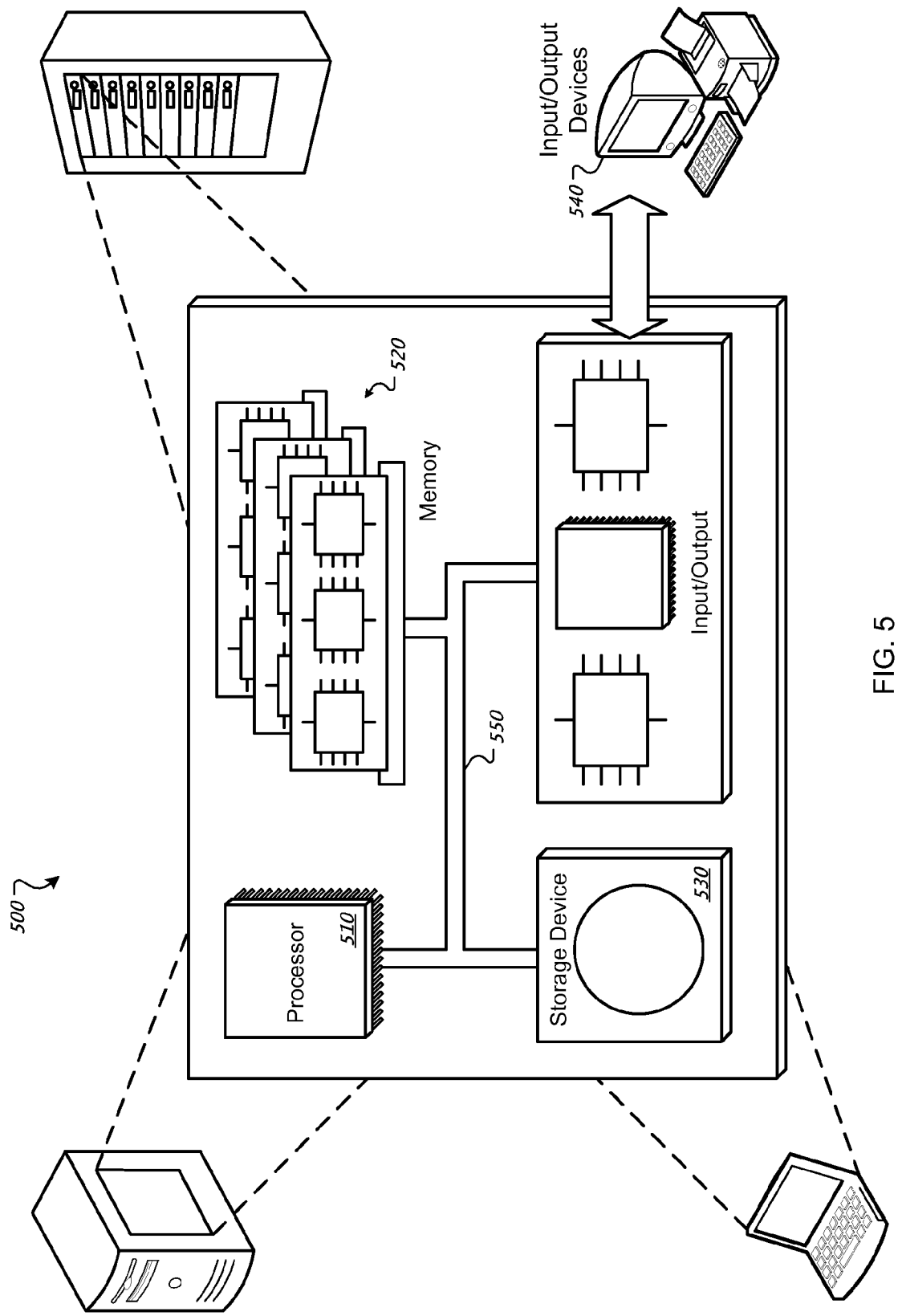
FIG. 5 shows a schematic diagram of an example computer system for implementing the features and processes described in reference to FIGS. 1-4.

Referring now to FIG. 5, a schematic diagram of an example computer system 500 is shown. The system 500 can be used for the operations described in association with the process 200 shown in FIG. 2, the process 300 shown in FIG. 3, and/or the process 400 shown in FIG. 4. The system 500 includes a processor 510, a memory 520, a storage device 530, and an input/output device 540. Each of the components 510, 520, 530, and 540 can, for example, be interconnected using a system bus 550. The processor 510 is capable of processing instructions for execution within the system 500. In one implementation, the processor 510 is a single-threaded processor. In another implementation, the processor 510 is a multi-threaded processor. The processor 510 is capable of processing instructions stored in the memory 520 or on the storage device 530 to display graphical information for a user interface on the input/output device 540. In some embodiments, a parallel processing set of systems 500 connected over a network may be employed, clustered into one or more server centers.

The memory 520 stores information within the system 500. In one implementation, the memory 520 is a computer-readable medium. In one implementation, the memory 520 is a volatile memory unit. In another implementation, the memory 520 is a non-volatile memory unit.

The storage device 530 is capable of providing mass storage for the system 500. In one implementation, the storage device 530 is a computer-readable medium. In various different implementations, the storage device 530 can, for example, include a hard disk device, an optical disk device, or some other large capacity storage device.

The input/output device 540 provides input/output operations for the system 500. In one implementation, the input/output device 540 includes a keyboard and/or pointing device. In another implementation, the input/output device 540 includes a display unit for displaying graphical user interfaces.

A number of embodiments have been described in this specification. Nevertheless, it will be understood that various modifications may be made without departing from the spirit and scope of the subject matter described in this specification. Accordingly, other embodiments are within the scope of the following claims.

What is claimed is:

1. A method comprising:
    for each cell group in a set of cell groups of a memory array:
        determining whether the cell group is defective;
        if the cell group is not defective, storing a first value in a first cell location of the cell group and a second value in a second cell location of the cell group; and
        if the cell group is defective, storing a third value that is opposite of the first value in the first cell location of the cell group and storing a fourth value that is opposite of the second value in the second cell location of the cell group.

2. The method of claim 1, further comprising:
    in response to determining that the cell group is defective, incrementing a number of defective cell groups.

3. The method of claim 2, further comprising:
    determining if the number of defective cell groups is greater than a repair limit; and
    if the number of defective cell groups is greater than the repair limit, indicating that the memory array fails.

4. The method of claim 3, where the repair limit is equal to a number of redundant cell groups in the memory array.

5. The method of claim 2, further comprising:
    after incrementing the number of defecting cell groups for all defective cell groups in the set of cell groups, storing the number of defective cell groups in a non-volatile location of the memory array.

6. The method of claim 5, further comprising:
    before storing the number of defective cell groups, repairing the defective cell groups with redundant cell groups in the memory array.

7. The method of claim 1, where the first value differs from the second value.

8. The method of claim 7, where the first value is 0 and the second value is 1.

9. The method of claim 1, where at least one cell group is a column of the memory array.

10. The method of claim 9, where the first cell location is a first row of the column, and the second cell location is a last row of the column.

11. The method of claim 1, where at least one cell group is a portion of a row of the memory array.

12. The method of claim 1, where the memory array is a non-volatile memory array.

13. A computer-readable medium having instructions stored thereon, which, when executed by a processor, causes the processor to perform operations comprising:
    for each cell group in a set of cell groups of a memory array:
        if the cell group is not defective, storing a first value in a first cell location of the cell group and a second value in a second cell location of the cell group;
        if the cell group is defective, determining if the first cell location of the cell group is set to the first value and determining if the second cell location of the cell group is set to the second value;
        if the first cell location of the cell group is set to the first value and the second cell location of the cell group is set to the second value, indicating that the memory array fails; and
        if the first cell location of the cell group is not set to the first value or the second cell location of the cell group is not set to the second value, storing a third value that is opposite of the first value in the first cell location of the cell group and storing a fourth value that is opposite of the second value in the second cell location of the cell group.

14. The computer-readable medium of claim 13, where the first value differs from the second value.

15. The computer-readable medium of claim 13, where the memory array is a non-volatile memory array.

* * * * *